US009099840B2

(12) United States Patent
Rosiewicz et al.

(10) Patent No.: US 9,099,840 B2
(45) Date of Patent: Aug. 4, 2015

(54) DISTRIBUTED FEEDBACK (DFB) LASER WITH SLAB WAVEGUIDE

(71) Applicant: Gooch and Housego PLC, Ilminster, Somerset (GB)

(72) Inventors: Alexander Rosiewicz, Stow, MA (US); Marcel Franz Christian Schemann, Maria Hoop (NL)

(73) Assignee: Gooch and Housego PLC, Somerset (GB)

( * ) Notice: Subject to any disclaimer, the term of this patent is extended or adjusted under 35 U.S.C. 154(b) by 0 days.

(21) Appl. No.: 14/455,396

(22) Filed: Aug. 8, 2014

(65) Prior Publication Data

US 2015/0043607 A1 Feb. 12, 2015

Related U.S. Application Data

(60) Provisional application No. 61/863,736, filed on Aug. 8, 2013.

(51) Int. Cl.
*H01S 3/08* (2006.01)
*H01S 5/12* (2006.01)
*H01S 5/32* (2006.01)

(52) U.S. Cl.
CPC .... *H01S 5/12* (2013.01); *H01S 5/32* (2013.01)

(58) Field of Classification Search
CPC .............. H01S 5/00; H01S 5/32; H01S 5/12; H01S 3/08027

USPC ............. 372/96, 50.11, 18, 20; 257/E33.001; 385/131

See application file for complete search history.

(56) References Cited

U.S. PATENT DOCUMENTS

| 6,577,660 B1 * | 6/2003 | Muroya ..................... 372/50.11 |
| 6,987,285 B2 | 1/2006 | Nagashima et al. |
| 7,542,503 B2 | 6/2009 | Anselm |
| 8,311,071 B2 | 11/2012 | Kato |
| 2003/0108076 A1 * | 6/2003 | Yoon et al. ...................... 372/45 |
| 2007/0195849 A1 * | 8/2007 | Takagi et al. ............... 372/50.11 |

* cited by examiner

*Primary Examiner* — Tuan Nguyen
(74) *Attorney, Agent, or Firm* — Jetter & Associates, P.A.

(57) ABSTRACT

A distributed feedback (DFB) laser includes a substrate of a compound semiconductor material, and quantum-well (QW) active layer(s) overlying the substrate. A p-doped cladding layer including the compound semiconductor material is on one side of the active layer and an n-doped cladding layer is on the other side. A grating is in one of the cladding layers configured to select an operating wavelength for the DFB laser. A waveguide structure in the n-doped cladding layer includes a waveguide layer of a first composition compositionally different from the compound semiconductor material having an optical thickness of 0.7 to 1.5 of the guided wavelength. The waveguide structure can further include a heterowaveguide stack including a plurality of alternating compositional layers beyond the waveguide layer each having a thickness between one quarter and one half the guided wavelength alternating the compound semiconductor material with a second composition defining a composition wavelength.

20 Claims, 4 Drawing Sheets

DISTRIBUTED FEEDBACK (DFB) LASER WITH SLAB WAVEGUIDE

CROSS REFERENCE TO RELATED APPLICATIONS

This application and the subject matter disclosed herein claims the benefit of Provisional Application Ser. No. 61/863,736 entitled "HIGH POWER DISTRIBUTED FEEDBACK (DFB) LASER" filed Aug. 8, 2013, which is herein incorporated by reference in its entirety.

FIELD

Disclosed embodiments relate to distributed feedback lasers with step-index planar (slab) waveguides.

BACKGROUND

A distributed feedback (DFB) laser is a type of laser diode, quantum cascade laser or optical fiber laser where the active region of the device is periodically structured as a diffraction grating. The diffraction grating acts as the wavelength selective element for at least one of the minors and provides the feedback, reflecting light back into the cavity to form the resonator. In the case of a semiconductor diode laser the diffraction grating includes a grating layer having a periodic refractive index which is different from the refractive index of the adjacent layers. One type of DFB laser has a step-index planar (slab) waveguide.

The DFB laser operates in a single mode emitting laser light of a stable single wavelength and thus is widely used as the light source in optical communication systems. The emission wavelength ($\lambda_{DFB}$) of the DFB laser is determined by the formula $\lambda_{DFB} = 2 n_{eff} \Lambda$, wherein $\Lambda$ is the spatial period of the diffraction grating and $n_{eff}$ is the effective refractive index of the waveguide of the laser device. Thus, $\lambda_{DFB}$ can be determined independently of the peak wavelength of the optical gain of the active layer. The DFB laser is categorized into two types including a refractive-index coupling type and a gain-coupling type based on the material of the diffraction grating.

High power C-band (1530 nm to 1565 nm) operating wavelength range DFB laser chips are available with ex-facet powers ~200 mW, slope efficiency ~0.2 W/A and optical far field with a 2:1 vertical to horizontal aspect ratio. These devices have relative intensity noise (RIN) values of ~−155 dB/Hz and native linewidths of ~500 kHz. While such DFB laser chips are generally useful, performance improvements are needed. Specifically, higher output power with better slope efficiency is needed together with a far field along with an aspect ratio closer to 1:1 to allow better coupling efficiency into circular waveguides such as optical fibers. Also, the RIN and linewidth provided by conventional DFB lasers operated at higher power can result in unacceptably high amplitude and phase noise for some applications.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include distributed feedback (DFB) laser chips formed on a substrate having a waveguide structure including a waveguide layer in the n-doped cladding layer that significantly reduces the mode intensity and thus the loss in the p-doped cladding layer and the active layer. A diffraction grating (hereafter a "grating") is in one of the p-doped and n-doped cladding layers configured to select an operating wavelength for the DFB laser. The waveguide layer is of a first composition that is compositionally different from the compound semiconductor material of the substrate, and generally has an optical thickness of 0.7 to 1.5 of the guided wavelength. The waveguide structure can further include a hetero-waveguide stack including a plurality of alternating compositional layers beyond the waveguide layer each generally having a thickness between one quarter and one half the guided wavelength alternating the compound semiconductor material with a second higher refractive index (nf) composition that defines a periodic composition wavelength.

The DFB laser has mirrors that can include an anti-reflective (AR) minor on a first end of a length of the DFB laser and a highly reflective (HR) minor opposite the AR minor on a second side of the length. The grating in one embodiment can comprise a partially corrugated (PC) grating including a PC grating portion between a first non-corrugated portion and a second non-corrugated portion. The PC grating portion is spaced apart from the HR minor and AR mirror by the first non-corrugated portion and second non-corrugated portion, respectively. The AR mirror generally has a reflectivity of at least 0.5%, with the reflectivity generally being between 0.5% and 5%.

BRIEF DESCRIPTION OF THE DRAWINGS

Reference will now be made to the accompanying drawings, which are not necessarily drawn to scale, wherein.

DETAILED DESCRIPTION

Figure 1A:
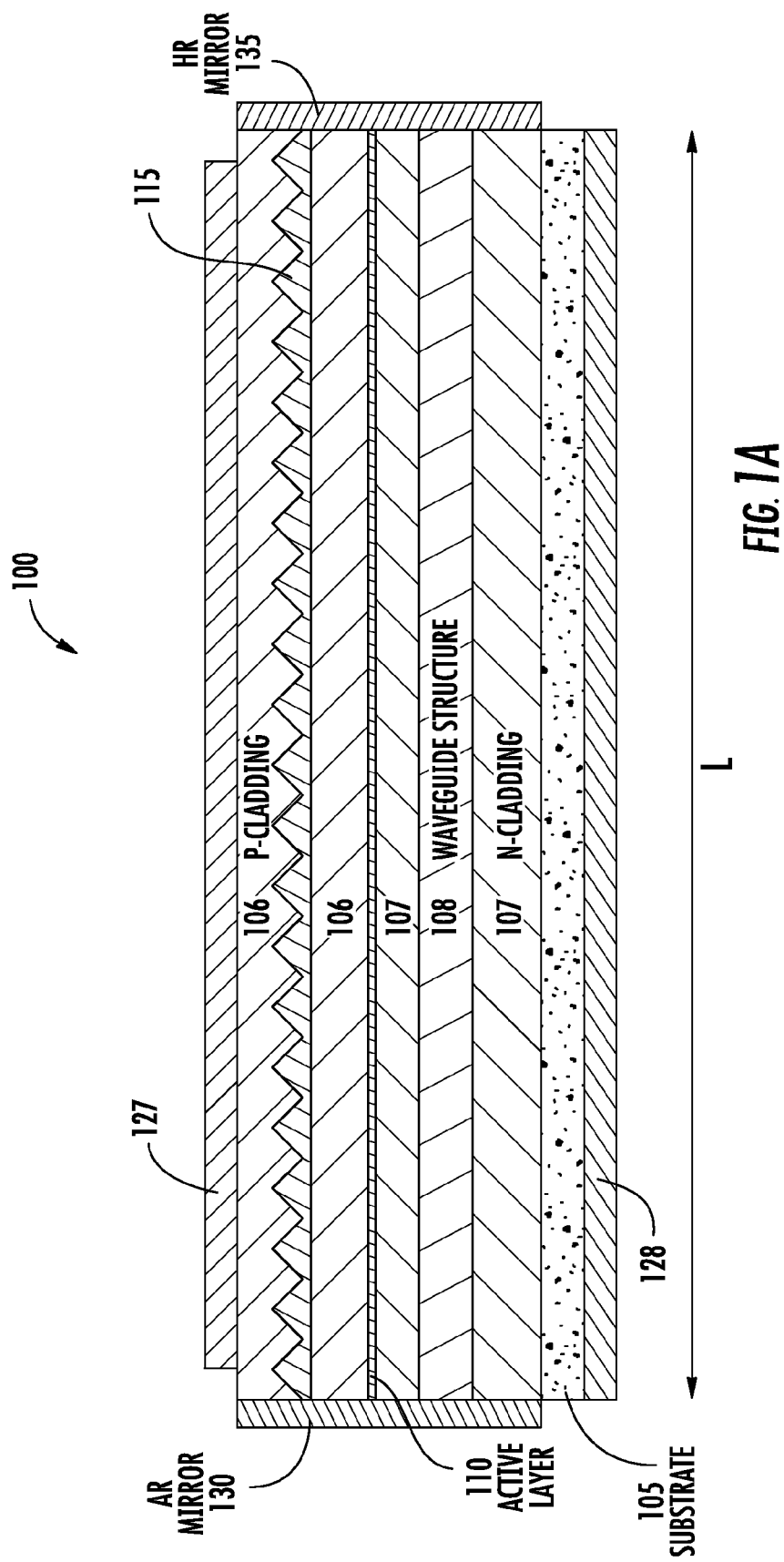
FIG. 1A is a cross sectional depiction of an example DFB laser with slab waveguide having an example waveguide structure in the n-doped cladding layer including least one waveguide layer that is compositionally different from the compound semiconductor material of the substrate, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a cross sectional depiction of an example DFB laser chip with slab waveguide (DFB laser) 100 built on a crystalline substrate (substrate) 105 comprising a compound semiconductor material, according to an example embodiment. DFB laser 100 includes at least one quantum-well (QW) active layer (active layer) 110 overlying the substrate 105, a p-doped cladding layer 106 comprising the compound semiconductor material on one side of the active layer 110, and an n-doped cladding layer 107 comprising the compound semiconductor material on another side of the active layer 110.

Figure 1B:
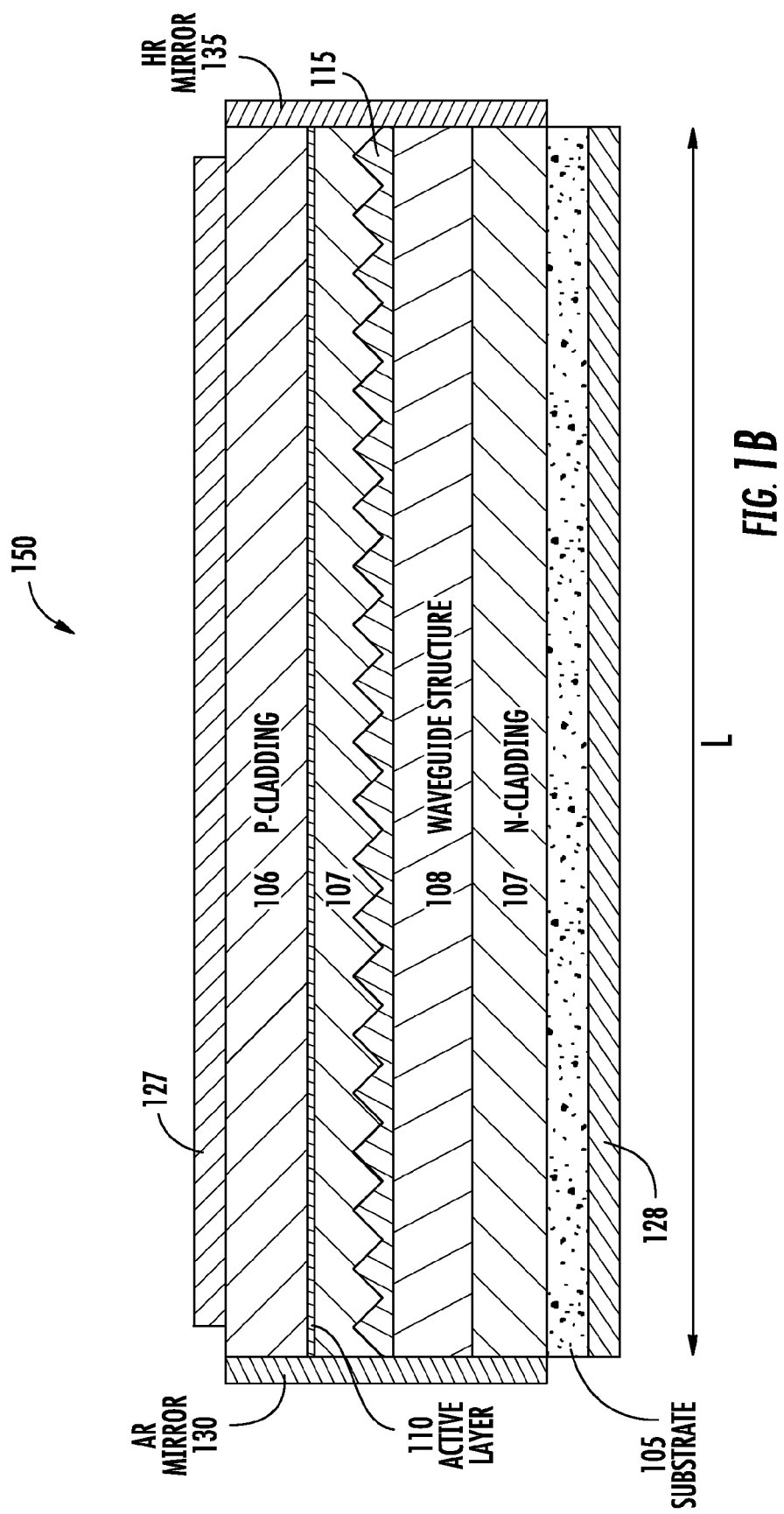
FIG. 1B is a cross sectional depiction of an example DFB laser with slab waveguide having an example waveguide structure in the n-doped cladding layer including least one waveguide layer that is compositionally different from the compound semiconductor material of the substrate, where the grating is in the n-doped cladding layer above the waveguide structure, according to an example embodiment.
Figure 2:
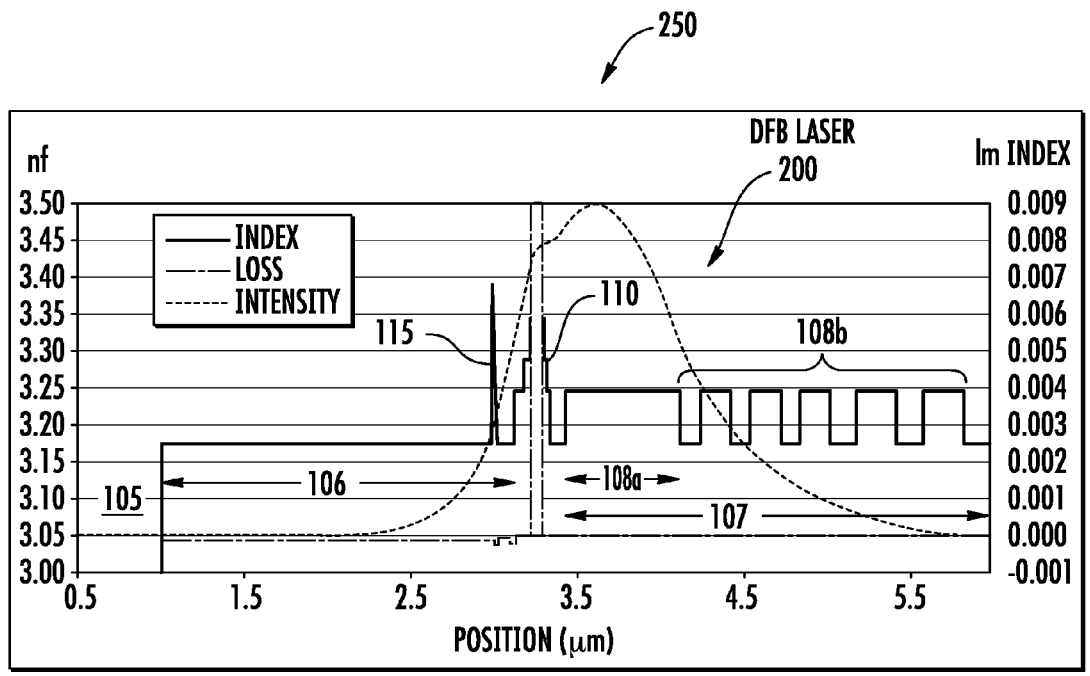
FIG. 2 is a diagram showing the refractive index, loss and mode intensity as a function of transverse position with the various layers of an example DFB laser with slab waveguide identified, according to an example embodiment.

A grating 115 is shown in the p-doped cladding layer 106 and is configured with a feature spacing to select an operating wavelength to provide an essentially single longitudinal lasing mode for DFB laser 100, such as about 1.55 µm in free-space in one particular embodiment. However, the grating 115 may also be in the n-doped cladding layer 107. For example, the grating 115 may generally be placed anywhere in either cladding layer (n-doped cladding layer 107 or p-doped cladding layer 106) in order to provide reasonable manufacturing tolerances, typically in a cladding region where the field intensity is around $\frac{1}{3}^{rd}$ (e.g., 20% to 45%) of the peak field intensity. As shown in FIG. 2 the gating 115 is within in the p-doped cladding layer 106 corresponding to about $\frac{1}{3}$rd of the peak field intensity. In FIG. 1B described below, grating 115 is instead within the n-doped cladding layer 107.

A waveguide structure 108 in the n-doped cladding layer 107 includes at least a waveguide layer (see waveguide layer 108a in FIG. 2 described below) comprising a first composition that is compositionally different from the compound semiconductor material. Waveguide layer 108 comprises a higher nf material (such as InGaAsP) to waveguide relative to the lower nf semiconductor material of the n-doped cladding layer 107 and the substrate 105 (e.g., both InP). The waveguide layer 108a generally has an optical thickness of 0.7 to 1.5 of the operating wavelength in the compound semiconductor material (the guided wavelength). For example, when the compound semiconductor material is InP, and the operating (free space) wavelength is 1.55 µm in TE mode, where InP has a nf of about 3.1 at around 1 µm, the guided wavelength is about 1.55 µm/3.1=0.5 µm.

DFB laser 100 can have a total length (L) defined by the distance between the AR minor 130 and the HR mirror 135 where the device has both its grating 115 and the active layer 110 extending the full distance (L) as shown in FIG. 1A to be 500 µm or more, such as up to 1,500 µm. This relatively long L is facilitated by the low waveguide loss described below provided by disclosed waveguide structures, such as waveguide structure 108. PC-DFB laser 300 having a PC grating 115' described below relative to FIG. 3 in contrast has an L that is less than the distance between AR mirror 130 and the HR minor 135 because it is instead defined by the length of only the corrugated portion 115a of the grating 115'.

AR mirror 130 and HR minor 135 are internal minors (integrally formed on the DFB laser 100) that can comprise distributed Bragg reflectors that provide a periodic variation in the effective refractive index by including multiple dielectric layers covering the cleaved end crystalline facets of the laser. As shown in FIGS. 1A and FIG. 1B (described below), AR minor 130 and HR mirror 135 both cover the cleaved end crystalline facets of the p-doped cladding layer 106, active layer 110, n-doped cladding layer 107 and the waveguide structure 108.

The DFB laser 100 includes a QW active layer structure (active layer) 110 including at least one QW layer overlying the compound semiconductor substrate 105 between the p-doped cladding layer 106 and the n-doped cladding layer 107. As noted above, the p-doped cladding layer 106 and n-doped cladding layer 107 both can comprise the same compound semiconductor material as the substrate 105.

The grating 115 is shown extending over the entire L of the DFB laser 100 so that the distance from the respective inner edges of the grating 115 to HR mirror 135 and AR minor 130 is zero. As known in the art, the grating 115 can be formed by etching a grating pattern using known DFB laser fabrication techniques. DFB laser 100 is shown including electrodes 127 and 128, typically being metals for low resistance contacts, for applying an electrical drive signal across the DFB laser 100.

FIG. 1B is a cross sectional depiction of an example DFB laser 150 with slab waveguide having an example waveguide structure in the n-doped cladding layer 107 including least one waveguide layer that is compositionally different from the compound semiconductor material of the substrate 105, where the grating 115 is in the n-doped cladding layer 107, according to an example embodiment. As described above, the grating 115 can be placed in a region where the field intensity is around $\frac{1}{3}$ (e.g., 20% to 45%) of the peak field intensity.

FIG. 2 is a diagram 250 showing the simulated nf, loss and mode intensity (electric field) as a function of transverse position with various layers for a DFB laser with slab waveguide shown as 200 identified, along with details for an example waveguide structure. The dimensions shown are scaled for an emission wavelength of about 1.55 µm. The field intensity shown is the intensity of the guided mode (in arbitrary units).

The example waveguide structure shown in FIG. 2 includes both a waveguide layer 108a and a hetero-waveguide stack 108b comprising a plurality of alternating compositional layers beyond the waveguide layer 108a each generally having a thickness between one quarter and one half the guided wavelength. The spacing range between the edge of waveguide layer 108a and the edge of the active layer 110 is typically from zero to 0.5 optical wavelengths.

The hetero-waveguide stack 108b is shown alternating layers of the compound semiconductor material of the substrate 105 (e.g., InP) with a second composition that is compositionally different (and has a higher nf, e.g., InGaAsP) from the compound semiconductor material which defines a composition wavelength. An optical thickness of the composition wavelength is generally from 0.5 to 1.0 of the guided wavelength. For disclosed DFB lasers, the waveguide structure 108 can include both the waveguide layer 108a and the hetero-waveguide stack 108b as shown in FIG. 2, or only one of these.

Waveguide layer 108a and hetero-waveguide stack 108b can be seen to offset a large part of the electric field into the n-doped cladding layer 107 which reduces loss as p-doped cladding layer 106 is recognized to be significantly lossier as due to higher optical absorption, it also has a higher electrical resistance. This low loss slab waveguide feature enables a longer disclosed DFB laser and therefore higher output DFB laser chip while still having a low threshold.

The intensity in the lossier p-doped cladding layer 106 is shown in FIG. 2 to be reduced significantly. While the DFB laser 200 design shown has a 2 µm thick p-doped cladding layer 106, the p-doped cladding layer 106 thickness can be reduced, such as to 1.5 µm or 1 µm resulting in losses of 3.2 and 3.5 per cm and far field of 26.8 and 27.4 degrees, respectively. This arrangement will also reduce series resistance considerably, but may depend on ridge overgrowth technology for implementation. The thickness of the waveguide layer 108a may also be varied as disclosed above. The QW confinement factor was found to be reduced from 0.5% to 0.3% such that the threshold QW gain remains roughly the same due to the longer laser length (1,500 µm) having lower losses.

The waveguide structure 108 and other layers of disclosed DFB lasers can be created by known epitaxial growth (e.g., Molecular Beam Epitaxy (MBE)) utilizing modified layer compositions so that the refractive index in wave-guiding portions of the n-doped cladding layer 107 being the waveguide layer 108a and the high index layers of the hetero-waveguide stack 108b are higher than their adjacent layers, such as 3.23 for InGaAsP vs. 3.18 InP. The refractive index difference and layer thicknesses can be selected in order to create a waveguide supporting a single fundamental spatial mode. From simulations performed the transverse far field for DFB laser 200 is about 26 degrees. The intensity in the p-doped cladding layer 106 and the active layer 110 has been found to be reduced significantly resulting in 6/cm overall internal loss, of which 3/cm is in the waveguide structure (See FIGS. 4A and 4B described below).

The material compositions of the waveguide layer 108a and hetero-waveguide stack 108b are realizable for thick layer epitaxial growth with good composition control. For example, for InP-based laser devices, this may be reactor dependent, since for example using small fractions of As in a reactor growing InP based materials may be challenging to make a material with a bandgap close to InP lattice matched InGaAsP material with a growth process where small fractions of Ga and As are added to slightly change the bandgap and refractive.

Figure 3:
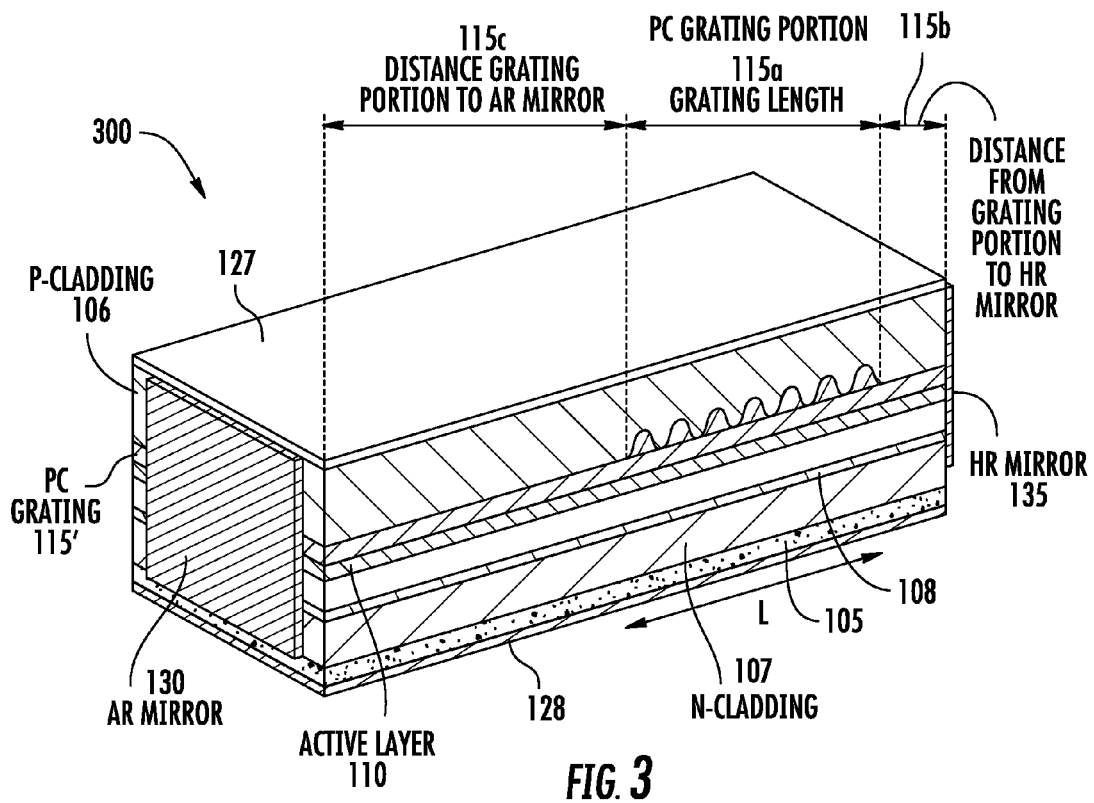
FIG. 3 is a perspective cross sectional view showing an example DFB laser having a PC grating portion (PC-DFB laser) in its p-doped semiconductor cladding layer, wherein the PC grating portion is spaced apart from the HR minor and AR mirror by respective non-corrugated (flat surface) portions, according to an example embodiment.

FIG. 3 is a perspective cross sectional view showing an example PC-DFB laser chip (PC-DFB laser) 300 having a PC grating 115' including a PC grating portion 115a in its p-doped semiconductor cladding layer 106 spaced apart from the HR minor 135 and AR mirror 130 by first and second non-corrugated (flat surface) portions 115b, 115c, according to an example embodiment. The sinusoidal shape of the PC grating portion 115a shown is arbitrary. The first non-corrugated portion 115b is generally at least 100 µm from the HR minor 135. The n-doped cladding layer 107 is shown including a disclosed waveguide structure 108. The PC-DFB laser 300 has an L shown that is less than the distance between AR minor 130 and the HR minor 135 (and length of the active layer 110) because it is instead defined by the length of the PC grating portion 115a as the length of the PC grating portion 115a is less than the length of the active layer 110.

As shown in FIG. 3, the second non-corrugated portion 115c can have a length greater than the length of the first non-corrugated portion 115b. The reflectivity of the AR minor 130 is generally between 0.5% and 5%, such as 0.5 to 3% while the reflectivity of the HR minor 135 is generally ≥80%. In a conventional Master Oscillator Power Amplifier (MOPA) design the front mirror reflectivity would be essentially 0% (e.g., <0.1% reflectivity) and thus the grating forms a laser with the rear minor and the section in front of the laser functions solely as an optical amplifier due to the 0% front mirror reflectivity since there is no reflection or interaction back into the laser cavity. This is recognized to lead to a degradation in noise performance due to the optical amplifier section of the MOPA.

PC-DFB laser 300 in contrast uses an AR minor 130 reflectivity of at least 0.5% (generally between 0.5% and 5%), which has been found when used in a disclosed PC-DFB laser design allows the entire device to act as one laser with good stability, low noise performance and high yield. Disclosed DFB lasers thus generally do not use a conventional essentially perfect (e.g., <0.1% reflectivity) AR mirror 130, which has been found to help ensure that the phase noise and RIN of the DFB laser remains low.

There is a significant synergy discovered between disclosed DFB lasers having slab waveguides and PC gratings when the AR minor 130 reflectivity is least 0.5% (as noted above generally being between 0.5% and 5%), which has been found to enable disclosed DFB laser performance to combine performance features from both DFB lasers and MOPAs in a single device. The slab waveguide DFB laser design as described above provides a low loss laser cavity, thus making long devices possible without significant degradation of the output slope efficiency (W/A). When disclosed DFB laser devices are long a high operating current can be utilized since that current is divided over a long laser device length, so that high current is recognized to be possible without having an excessive current density in the device. Adding a disclosed PC grating with an AR mirror 130 reflectivity of least 0.5% provides a DFB section and gain sections in combination the with slab waveguide provides MOPA-like output power capability, with the efficiency, low RIN and low linewidth of lower power DFB lasers.

EXAMPLES

Disclosed embodiments are further illustrated by the following specific Examples, which should not be construed as limiting the scope or content of this Disclosure in any way.

Figure 4A:
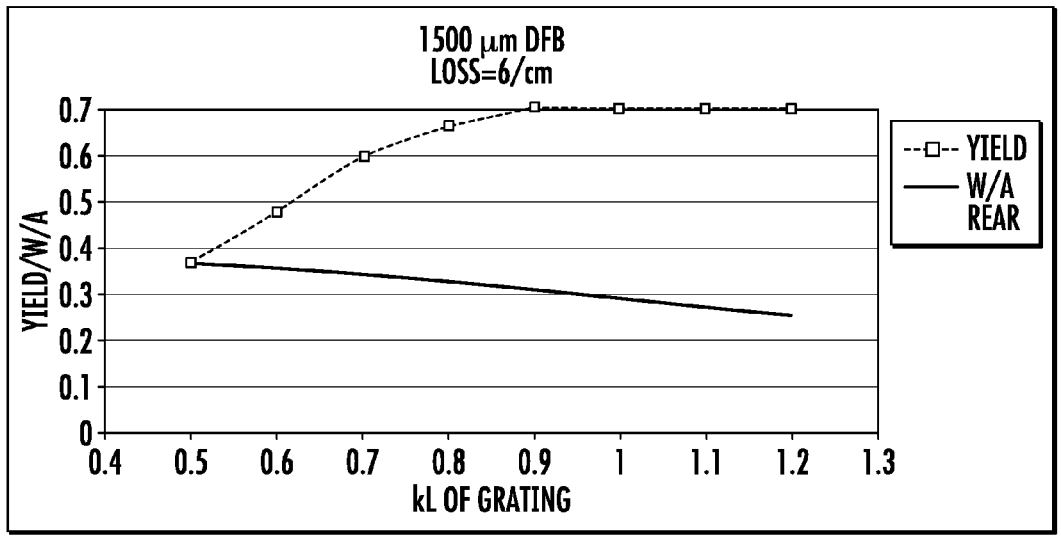
FIG. 4A is a plot of production yield and output power efficiency in watts (W)/amp (A) as a function of the grating coupling constant to the active layer for the example DFB laser with slab waveguide shown in FIG. 2.

FIG. 4A is a plot of production yield as a fraction and output power efficiency in W/A as a function of grating coupling constant (kL) to the active layer 110 for the DFB laser 200 shown in FIG. 2. The grating 115 for DFB laser 200 was uniform and was along the entire L of the DFB laser. A yield of 70% at a minor efficiency of 0.3 W/A (W/A rear curve) was obtained. At equivalent current density the expected output power is up to 50% more than the output power obtained with similar simulations for a 1,000 µm (1 mm) long 4 QW DFB laser per a conventional reference design having the same structure including the same grating 115 in the p-cladding 106 and active layer 110 that only lacked a disclosed waveguide structure 108.

Regarding PC grating embodiments, such as PC-DFB laser 300 shown in FIG. 3, for technological and cost (write-time) reasons an E-beam written grating portion should generally be limited to 500 µm in length per laser. A longer grating if desired can be created using holographic processes. In a yield analysis it was found that placing a 500 µm PC grating portion 115a at the AR mirror 130 of a 1,500 µm mirror-to-minor DFB laser results in zero single mode yield. It was also found that placing the PC grating portion 115a at the rear mirror (HR mirror 135) results in poor yield. However, it was discovered having non-corrugated (flat surface) Fabry-Perot (FP) gain sections in front and behind the PC grating portion 115a in a proper length range (see FIG. 4B and related disclosure below) results in good performance. So unlike conventional PC-DFB lasers which have their grating portion at one minor and one FP section, it was found that using two FP sections in the proper length range sandwiching the PC grating portion 115a provides better performance.

Figure 4B:
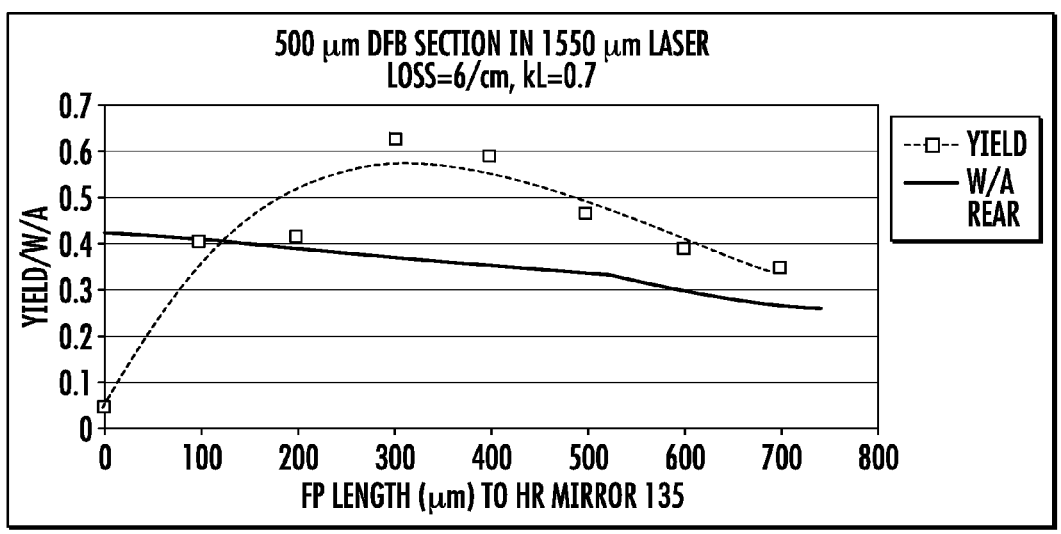
FIG. 4B is a plot of production yield as a fraction and efficiency in W/A vs. the distance from the PC grating portion to the HR minor on the x-axis of a 500 µm long corrugated portion for the PC-DFB laser shown in FIG. 3 having a 1,500 µm distance between the mirrors.

FIG. 4B is a plot of production yield as fraction and efficiency in W/A vs. the distance from the PC grating portion 115a to the HR mirror 135 on the x-axis of a 500 μm PC grating portion 115a in the PC-DFB laser 300 shown in FIG. 3 having a 1,500 μm distance between the respective mirrors. The AR reflectivity was 0.5 to 1%. The yield (dashed line, markers) peaks at a distance of 300 μm between HR (front) minor and PC grating portion 115a, the efficiency (solid line) is significantly improved beyond that of a conventional PC-DFB laser. For a conventional PC-DFB laser the PC grating has x=0 (thus extending to the HR minor), while FIG. 4B evidences the PC grating portion 115a for x>100 μm (thus offset from the HR minor 135) provides improved performance. In testing a RIN better than −155 dB/Hz and linewidth less than 500 kHz was also found.

It is thus found to be beneficial to use a PC grating portion 115a in the laser that is separated both from the HR mirror 135 and the AR minor 130. The separation from the HR minor 135 in some embodiments is greater than 100 μm (a FP length) that is less than 400 μm shown in FIG. 3. The separation of the PC grating portion 115a from the AR mirror 130 being greater than the separation of the PC grating portion 115a from the HR mirror 135 can provide improved results. However, in other embodiments, the separation of the PC grating portion 115a from the AR mirror 130 can also be less than the separation of the PC grating portion 115a from the HR mirror 135. As noted above, the reflectivity AR minor 130 is generally at least 0.5%, such as between 0.5 and 5%.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A distributed feedback (DFB) laser, comprising:
a substrate comprising a compound semiconductor material;
at least one quantum-well (QW) active layer (active layer) overlying said substrate;
a p-doped cladding layer comprising said compound semiconductor material on one side of said active layer;
an n-doped cladding layer comprising said compound semiconductor material on another side of said active layer;
a diffraction grating in said p-doped cladding layer or in said n-doped cladding layer configured to select an operating wavelength for said DFB laser, and
a waveguide structure in said n-doped cladding layer including a waveguide layer comprising a first composition that is compositionally different from said compound semiconductor material, said waveguide layer having an optical thickness of 0.7 to 1.5 of said operating wavelength in said compound semiconductor material (guided wavelength).

2. The DFB laser of claim 1, wherein said compound semiconductor material comprises indium phosphide (InP), gallium arsenide (GaAs) or gallium nitride (GaN).

3. The DFB laser of claim 1, wherein a closest edge of said waveguide layer is from zero to 0.5 of said guided wavelength from said active layer.

4. The DFB laser of claim 1, wherein said waveguide structure further comprises a hetero-waveguide stack including a plurality of alternating compositional layers beyond said waveguide layer each having a thickness between one quarter and one half said guided wavelength alternating said compound semiconductor material with a second composition that is compositionally different from said compound semiconductor material defining a composition wavelength.

5. The DFB laser of claim 4, wherein said second composition and said first composition comprise a same material.

6. The DFB laser of claim 4, wherein an optical thickness of said composition wavelength is from 0.5 to 1.0 of said guided wavelength.

7. The DFB laser of claim 1, wherein said compound semiconductor material is InP and wherein said first composition comprises Indium Gallium Arsenide Phosphide (InGaAsP).

8. The DFB laser of claim 1, wherein said at least one QW active layer comprises a plurality of said active layers.

9. The DFB laser of claim 1,
wherein said grating comprises partially corrugated PC grating including a PC grating portion between a first non-corrugated portion and a second non-corrugated portion, and
further comprising an anti-reflective (AR) mirror on a first end of a length of said DFB laser and a highly reflective (HR) mirror opposite said AR mirror on a second side of said length;
wherein said PC grating portion is spaced apart from said HR mirror and said AR minor by said first non-corrugated portion and said second non-corrugated portion, respectively.

10. The DFB laser of claim 9, wherein a length of said first non-corrugated portion is at least 100 μm from said HR minor.

11. The DFB laser of claim 9, wherein said second non-corrugated portion has a length greater than said length of said first non-corrugated portion.

12. The DFB laser of claim 9, wherein a reflectivity of said AR minor is between 0.5% and 5%.

13. The DFB laser of claim 9, wherein a reflectivity of said HR minor is ≥80%.

14. A distributed feedback (DFB) laser, comprising:
a substrate comprising a compound semiconductor material;
at least one quantum-well (QW) active layer (active layer) overlying said substrate;
a p-doped cladding layer comprising said compound semiconductor material on one side of said active layer;
an n-doped cladding layer comprising said compound semiconductor material on another side of said active layer;
a diffraction grating in said p-doped cladding layer or in said n-doped cladding layer configured to select an operating wavelength for said DFB laser, said grating comprising partially corrugated (PC) grating including a PC grating portion between first non-corrugated portion and a second non-corrugated portions, and
a waveguide structure in said n-doped cladding layer including a waveguide layer comprising a first composition that is compositionally different from said compound semiconductor material, said waveguide layer having an optical thickness of 0.7 to 1.5 of said operating wavelength in said compound semiconductor material (guided wavelength),
said waveguide structure further comprises a hetero-waveguide stack including a plurality of alternating compositional layers beyond said waveguide layer each having a thickness between one quarter and one half said guided wavelength alternating said compound semiconductor material with a second composition that is compositionally different from said compound semiconductor material defining a composition wavelength, and
an anti-reflective (AR) mirror on a first end of a length of said DFB laser having a reflectivity between 0.5% and 5%, and a highly reflective (HR) mirror opposite said AR mirror on a second side of said length, wherein said PC grating portion is spaced apart from said HR mirror and said AR mirror by said first non-corrugated portion and said second non-corrugated portion, respectively.

15. The DFB laser of claim 14, wherein said second composition and said first composition comprise a same material.

16. The DFB laser of claim 14, wherein an optical thickness of said composition wavelength is from 0.5 to 1.0 of said guided wavelength.

17. The DFB laser of claim 14, wherein said compound semiconductor material is InP and wherein said first composition comprises Indium Gallium Arsenide Phosphide (InGaAsP).

18. The DFB laser of claim 14, wherein a length of said first non-corrugated portion is at least 100 μm from said HR minor.

19. The DFB laser of claim 14, wherein said second non-corrugated portion has a length greater than said length of said first non-corrugated portion.

20. The DFB laser of claim 14, wherein a reflectivity of said HR mirror is ≥80%.

* * * * *